United States Patent [19]

Shufflebotham

[11] Patent Number: 5,711,998
[45] Date of Patent: Jan. 27, 1998

[54] METHOD OF POLYCRYSTALLINE SILICON HYDROGENATION

[75] Inventor: Paul Kevin Shufflebotham, San Jose, Calif.

[73] Assignee: Lam Research Corporation, Fremont, Calif.

[21] Appl. No.: 656,673

[22] Filed: May 31, 1996

[51] Int. Cl.$^6$ ........................................... B05D 3/06
[52] U.S. Cl. .......................... 427/535; 427/527; 437/937
[58] Field of Search ............................... 427/535, 527; 437/937

[56] References Cited

U.S. PATENT DOCUMENTS 5,314,603  5/1994  Sugiyama et al. ............... 204/298.32

OTHER PUBLICATIONS

Peter Singer, "Trends in Plasma Sources: The Search Continues", *Semiconductor International*, Jul. 1992, pp. 5–9.
Michael A. Lieberman and Allan J. Lichtenberg, *Principles of Plasma Discharges and Materials Processing*, 1994, Published by A Wiley–Interscience Publication, p. 388.
Nakazawa et al, Appl. Phys. Lett. 51(20) Nov. 1987, pp. 1623–1625.

Primary Examiner—Roy V. King
Attorney, Agent, or Firm—Hickman Beyer & Weaver

[57] ABSTRACT

A method of hydrogenating poly-Si in an electrical device including the step of placing a substrate having a poly-Si component in a radio frequency induced low pressure, high density plasma reactor. The method further includes the step of introducing into the radio frequency induced low pressure, high density plasma reactor a gas including at least hydrogen or deuterium. The hydrogenation of the poly-Si component is accomplished by striking a plasma in the radio frequency induced low pressure, high density plasma reactor under conditions that promote hydrogenation of the poly-Si component.

38 Claims, 5 Drawing Sheets

| CRITICAL PARAMETERS | BROAD RANGE | PREFERRED RANGE | MORE PREFERRED RANGE |
|---|---|---|---|
| TCP POWER (WATTS) | 300 to ≥ 2000 | 500 to 2000 | 1000 |
| BOTTOM POWER (WATTS) | 0 to ≈ 500 | 50 to 200 | 100 |
| TEMPERATURE (°C) | 100 to 350 | 250 to 350 | 300 |
| HYDROGEN GAS PRESSURE (milliTorr) | 0.1 to 50 | 1 to 30 | 5 |
| PROCESSING TIME PER SUBSTRATE (MIN) | 10 TO A VALUE OF TIME LIMITED BY THE THROUGHPUT RATE | 10 | 45 |

FIGURE 5

METHOD OF POLYCRYSTALLINE SILICON HYDROGENATION

BACKGROUND OF THE INVENTION

This invention relates to hydrogenating electrical devices containing polycrystalline silicon (poly-Si) using a high density plasma reactor. More particularly, it relates to hydrogenating electrical devices containing poly-Si using a transformer coupled plasma (TCP) reactor.

Polysilicon is used in various electrical devices such as transistors for flat panel displays, light valves (for projection displays), solar cells, and MOSFETs for integrated circuits. In these applications, polysilicon typically is deposited on a variety of substrates such as glass or single crystal semiconductors. In flat panel displays and light valves, for example, it may be deposited on glass or quartz where it serves as a gate electrode for thin film transistors and as the interconnect lines between transistors. In solar cells, it may be deposited on such diverse substrates as silicon or other semiconductor substrates, quartz, glass and polyimide.

Unfortunately, the electrical properties of the poly-Si tend to degrade during processing steps following poly-Si deposition. This degradation is attributed to either low deposition temperatures or to process steps that follow the poly-Si deposition step and are performed at relatively high temperatures. When the poly-Si is deposited under low deposition temperatures, on a substrate such as glass, it contains insufficient hydrogen in the polycrystalline grain boundaries. The hydrogen is necessary to tie up vacant bond sites (known as "dangling bonds") at the surfaces of the poly-Si grain boundaries. If these dangling bonds are not passivated (by bonding to hydrogen atoms or other material), they act as a trap for the charge carriers. This degrades the device's performance by (1) increasing the resistance of the polysilicon and/or (2) causing threshold voltage shifts when the polysilicon serves as a gate electrode.

While polysilicon may be deposited under conditions sufficient to have hydrogen passivate dangling bonds at grain boundaries during the polysilicon deposition process, such hydrogen may be largely driven off in relatively high temperature processing steps (e.g., >300° C.) which follow the polysilicon deposition step. Thus, despite suitable poly-Si deposition conditions, the final device may be detrimentally affected by problems associated with dangling bonds.

To remedy this problem, some processes employ a late-stage hydrogenation procedure in which the device is hydrogenated near the end of processing to reintroduce hydrogen atoms to the poly-Si grain boundaries. Some conventional processes perform late stage hydrogenation by heating a completed device to 300° C. and exposing it to hydrogen plasma generated by a parallel plate radio frequency (RF) reactor. See for example, Kim et al. "Structural Dimension Effects of Plasma Hydrogenation on Low-Temperature Poly-Si Thin Film Transistors" Japanese Journal of Applied Physics, Vol. 33, pp. 649–653 (1994). In these processes, the hydrogen diffuses through the device layers, eventually reaching the poly-Si grain boundaries and passivating the dangling bonds. A problem with this approach is that the hydrogenation step is extremely slow; hydrogenation times of ten hours or more per substrate are common. Thus, improved device performance comes at the expense of reduced process throughput.

Employing a parallel plate radio frequency (RF) system to hydrogenate dangling bonds is well known in the current technology. FIG. 1 shows a typical parallel plate RF system prevalent in the art. The parallel plate RF system includes a plasma processing chamber 102, which contains a top electrode 110 at the top and a chuck 104 at the bottom to hold a substrate 106. Top electrode 110 is energized by a first RF energy source 112 and chuck 104 is energized by a second RF energy source 114. Chuck 104 may come equipped with a heater (not shown) which heats up the chuck by radiant or conductive heating. The plasma processing chamber 102 may also be equipped with a gas inlet port 116 and a gas outlet port 118.

The process of hydrogenation begins by placing a substrate 106 containing poly-Si inside plasma processing chamber 102. Hydrogen gas is introduced into plasma processing chamber 102 through gas inlet port 116 to pressurize the chamber from approximately 100 milliTorr to several Torrs. Top electrode 110 and chuck 104 act as electrodes when energized by RF energy sources 112 and 114 to strike a plasma inside processing chamber 102. The plasma is believed to primarily consist of active species such as $H_3^+$, $H_2^+$, $H^+$ and H, which are deposited on the substrate 106. The substrate temperature is preferably sustained at about 250°–300° C. facilitating diffusion of the active species into substrate 106. Over a period of time, these deposited particles diffuse through the substrate until they reach the poly-Si dangling bonds and passivate the vacant bond sites. Typically, it takes as long as 8–10 hours to complete hydrogenation on a single substrate. This slow rate of hydrogenation is attributed to the application of low density plasma. As can be appreciated by those skilled in the art, this slow rate of hydrogenation reduces the overall throughput of wafers.

Conducting the late stage hydrogenation reaction in an electron cyclotron resonance (ECR) high density plasma source operating at low pressure (at sub-milliTorr pressures) have been shown to reduce the hydrogenation time from hours to tens of minutes for certain types of substrates such as display panels. See for example Takeshita et al. "Effects of ECR Hydrogen-Plasma Treatment on Narrow-Stripe Polycrystalline Silicon Thin-Film Transistors" Japanese Journal of Applied Physics, Vol. 28, pp. 358–360 (1989); T. Unagami and T. Takeshita "High-Performance Poly-Si TFT's with ECR-Plasma Hydrogen Passivation IEEE Transactions on Electron Devices, Vol 36, No. 3, pp. 529–533 (1989); Ditzio et al. "Short Time Electron Cyclotron Resonance Hydrogenation of Polycrystalline Silicon Thin-Film Transistor Structures" Applied Physics Lett., Vol 56, No. 12, pp. 1140–1142 (1990). It is believed that the basic mechanism responsible for the increased hydrogenation speed is a very high dissociation rate of $H_2$ into active species such as $H_3^+$, $H_2^+$, $H^+$ and H caused by the high density plasma source.

FIG. 2 shows a typical ECR system 200 known in the art. A substrate 206 rests on a chuck 204, which may be biased by a RF generator (not shown), disposed inside a plasma chamber 216. A turbomolecular pump 210 controls the flow of hydrogen inside plasma chamber 216. A wave guide 212 brings microwaves inside source chamber 214, which is located above plasma chamber 216. Large magnets 208 surrounding source chamber 214 generate a magnetic field that sets up a resonance zone inside the source chamber, where the electrons gyrate at the same frequency as the microwave. As a result, a plasma is generated below the source and spreads out following the magnetic field lines representatively shown as lines 220 and 222 inside plasma chamber 216 and onto substrate 206.

Hydrogenation with such ECR systems, unfortunately, suffers from several drawbacks. First, efficient hydrogenation in ECR systems requires operating at extremely low pressures (in sub-milliTorr range), yet pumping a very light molecule such as $H_2$ through a normal turbomolecular pump is very difficult. Pumping $H_2$ under these low pressure conditions requires a very expensive ultra-high vacuum system. Second, ECR plasma systems are notoriously difficult to scale up to large substrates, such as 300 mm wafer, flat panel displays or solar cells. Third, ECR plasma systems are complex and expensive, with large chambers, complex magnet assemblies and associated power supplies, and expensive microwave components.

In the view of above, what is needed is a hydrogenating process that is at least as fast as the hydrogenating process obtained by an ECR high density plasma source without bearing the high costs and complexity associated with such systems.

SUMMARY OF THE INVENTION

To achieve the foregoing, the present invention provides a transformer coupled plasma (TCP) reactor as a plasma generating source in a process of hydrogenating poly-Si in electrical devices on substrates. Suitable devices for hydrogenation in accordance with the present invention include, for example, solar cells, imaging arrays such as flat panel displays and light valves, and MOSFETs and the like. To ensure that the hydrogen tying up silicon dangling bonds during the TCP hydrogenation step is not subsequently driven off, the step is preferably performed only after the electrical devices on the substrate has been otherwise completely fabricated.

In one aspect, the invention provides a sequence of method steps for hydrogenating poly-Si in an electrical device. The method steps include the following: (1) placing a substrate having a poly-Si component in a radio frequency (RF) induced low pressure, high density plasma reactor; (2) introducing into the RF induced low pressure, high density plasma reactor a gas including at least hydrogen or deuterium; and (3) striking a plasma in the RF induced low pressure, high density plasma reactor under conditions that promote hydrogenation of said poly-Si component. Generally, RF induced low pressure, high density plasma reactor includes a transformer coupled plasma reactor, in which the plasma is energized by transformer couple action. In a preferred embodiment, the transformer couple action is provided by a coil located on top of a dielectric window and coupled to a RF power source.

The gas is introduced into the RF induced low pressure, high density plasma reactor through a gas introduction mechanism such as a ring which is included inside the RF induced low pressure, high density plasma reactor. Preferably, the reactor includes a turbomolecular pump for drawing the gas through the reactor interior. The gas pressure in the reactor should be maintained between about 0.1 and 50 milliTorr, or more preferably between 1 and 30 milliTorr, and most preferably at about 5 milliTorr.

The step of striking a plasma involves supplying radio frequency power to the reactor electrode coil at a power of between about 300 and 2000 Watts, or more preferably between about 500 and 2000 Watts, and most preferably at about 1000 Watts. The method may include an additional step of applying a bias to an electrode disposed under the substrate to increase the momentum of charged species striking the substrate. This bias may be provided at power of between about 0 and 500 Watts, more preferably between about 50 and 200 Watts, and most preferably at about 100 Watts. Additionally, the step of striking the plasma is conducted under conditions such that the substrate's temperature is maintained at a temperature to promote hydrogenation. This temperature may be between about 100° and 350° C., or more preferably between about 250° and 350° C., and most preferably about 300° C.

In one preferred embodiment, the plasma is generated under the following conditions: a substrate temperature of between about 100° and 350° C. and a gas pressure in the reactor of between about 0.1 and 50 milliTorr. In a particularly preferred embodiment, the gas pressure is provided at between about 1 and 30 milliTorr and at a temperature of between about 250° and 350° C., with the radio frequency power to the coil being supplied at a power of about 1000 Watts.

Under these conditions, sufficient poly-Si hydrogenation may occur after at least about 10 minutes and more preferably at least about 45 minutes of exposure to the TCP reactor plasma.

These and other features of the present invention will be described in more detail below in the detailed description of the invention and in conjunction with the following figures.

BRIEF DESCRIPTION OF THE DRAWINGS

FIG. 5 is a table of the values of various reactor operation parameters that may be employed in TCP reactors to hydrogenate substrates containing poly-Si in accordance with this invention.

DETAILED DESCRIPTION OF THE PREFERRED EMBODIMENTS

An invention is described for a process of hydrogenating poly-Si in electrical devices using a radio frequency (RF) induced low pressure, high density plasma reactor. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The hydrogenating process as described by the present invention generally comes before the deposition of the passivation layer which maybe one of the final steps in manufacturing most electrical devices. However, it should be understood that the invention is not so limited and that the hydrogenation process described herein may actually be performed at any step in a process of fabricating an electrical device.

Various poly-Si containing electrical components may be hydrogenated in accordance with the teachings of this invention. For example, an array of thin film transistors provided on a substrate such as flat panel display or light valve may be hydrogenated as described. In addition, solar cells, MOSFET devices or virtually any device having a poly-Si component may be hydrogenated as described. Typically, the starting product for hydrogenation will be a substrate having a nearly complete collection of electronic devices or is one that has undergone substantially all other high temperature steps. Various substrates may be employed for thin film devices having poly-Si to be hydrogenated. According to the teachings of the present invention includes one or more materials selected from the group consisting of glass, quartz, silicon, gallium arsenide, and polyimide.

Figure 1:
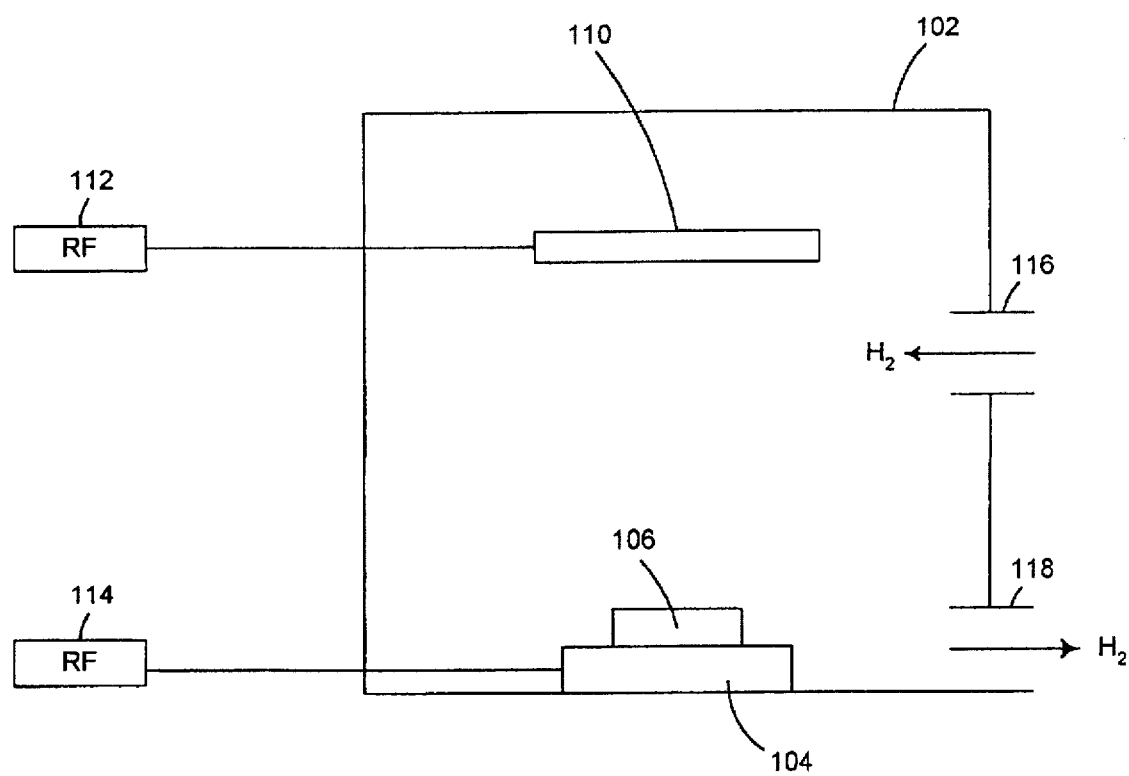
FIG. 1 is a block diagram of a typical parallel plate radio frequency (RF) system used for hydrogenating poly-Si in electrical devices.
Figure 2:
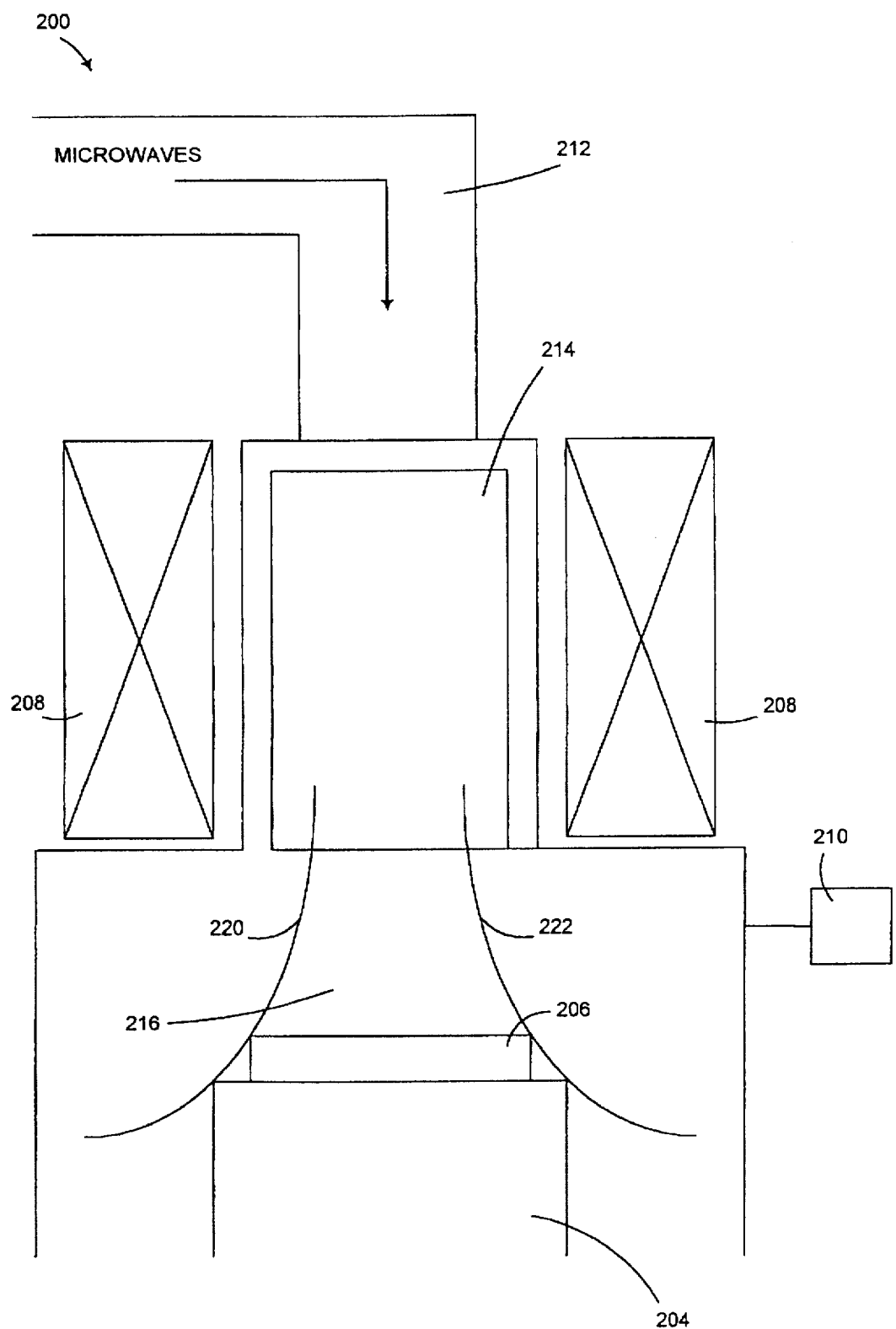
FIG. 2 is a block diagram of a typical electron cyclotron resonance (ECR) system used for hydrogenating poly-Si in electrical devices.
Figure 3:
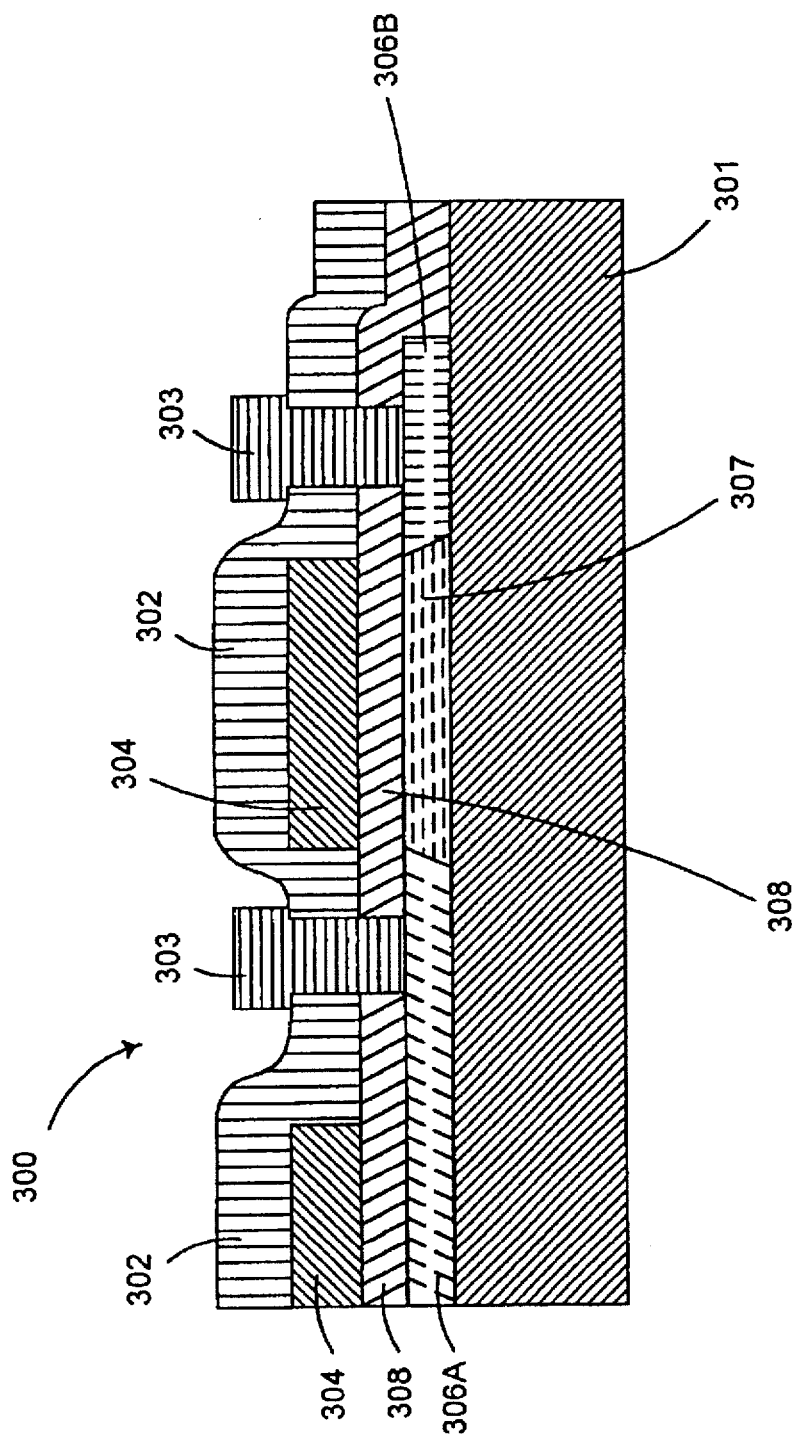
FIG. 3 is a side sectional view of a single transistor from an imaging array, which transistor contains a poly-Si gate that may be hydrogenated in accordance with a preferred embodiment of the present invention.

A cross sectional diagram of a representative poly-Si thin film device 300 is shown in FIG. 3. This device includes on a glass substrate 301, from top to bottom an oxide layer 302, a gate 304, a gate dielectric 308, a source 306A, a drain 306B and a channel region 307. A layer of aluminum is disposed as shown on both sides of oxide 302, gate 304, gate oxide 308, and above source 306A and drain 306B. Inside the thin film transistor, poly-Si may reside in source 306A, drain 306B channel 307 and gate 304. During a typical hydrogenation process, hydrogen species diffuses through the various layers of device 300 to reach and passivate the poly-Si dangling bonds present in source 306A, drain 306B, channel 307 and gate 304.

Figure 4:
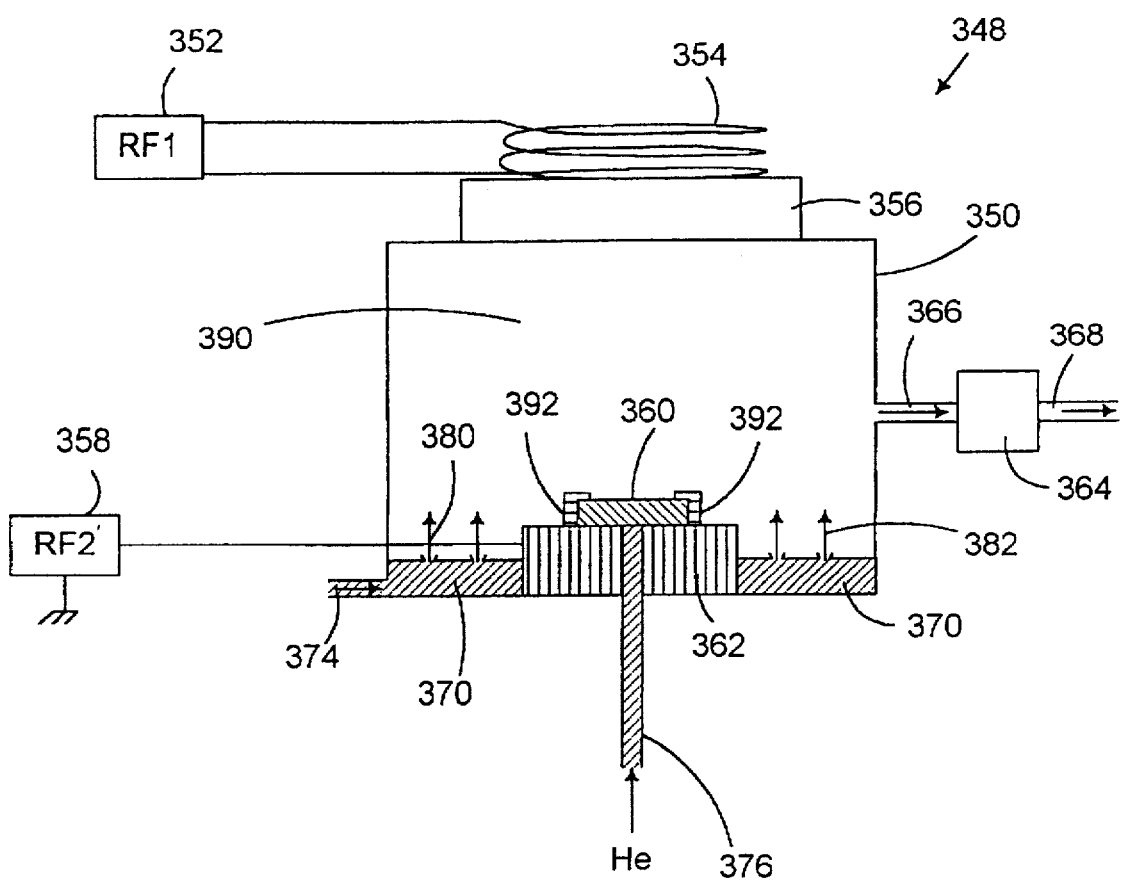
FIG. 4 is a cross-sectional view of a transformer coupled plasma (TCP) reactor used for hydrogenating poly-Si in accordance with the present invention.

FIG. 4 is a representation of a TCP system 348 that may be employed to hydrogenate poly-Si components in accordance with the process of this invention. In the preferred embodiment, a TCP system known as the TCP 9400™, available from Lam Research Corporation of Fremont, Calif. is employed and described herein for ease of illustration. It should be borne in mind that the invention is not limited to this particular TCP system configuration and may in fact be implemented in any high density, low pressure plasma system, preferably one having its plasma induced by an inductive coupling action.

In FIG. 4, the TCP system 348 has a reaction chamber 350. Above chamber 350, there is disposed a dielectric window 356 and a coil 354 energized by a RF generator 352, typically via a matching network (not shown). The RF generator 352 for coil 354 is typically grounded on one end and connected to coil 354 on the other end. Dielectric window 356 can be made of any suitable material, in one embodiment, however, it is made of quartz. Coil 354 implemented in the system can be planar or shaped appropriately according to reactor configuration.

Inside reaction chamber 350, there is a plasma processing region 390 located between dielectric window 356 and substrate 360. A clamp 392 may be provided to secure substrate 360 on a chuck 362. Clamp 392 may be a mechanical clamp or an electrostatic clamp. In some instances, however, clamp 392 may not be necessary. Chuck 362 is typically an aluminum work piece and preferably biased (also typically via a matching network) by a radio frequency generator 358, which typically operates at a standard frequency of 13.56 MHz to generate a DC bias which directs the active charged species toward the substrate.

Alternatively chuck 362 is equipped with a helium port 376 that extends from underneath substrate 360 into the substrate/chuck interface and supplies a heat transfer gas such as helium or some other noble gas to the region between substrate 360 and chuck 362 to maintain the temperature of substrate 360 at a desired level during plasma processing.

Reaction chamber 350 has a gas inlet port 374 that connects to a gas ring 370 surrounding the base of chuck 362. Gas ring 370 has openings 380 and 382 that provide vents to plasma processing region 390. The source gas commonly includes hydrogen gas. It should be understood, however, that although hydrogen gas is mentioned in the embodiments herein for consistency and ease of illustration, a deuterium gas, a hydrogen and deuterium mixture, or any of the above diluted with an inert gas, e.g. argon or neon may well be employed in place of the hydrogen gas. It is believed that using a diluent as opposed to using pure hydrogen gas enhances the dissociation rate of hydrogen and therefore produces more $H^+$, $H_2^+$, $H_3^+$ ions in the plasma. A turbomolecular pump 364 which is equipped with an inlet 366 and an outlet 368 evacuates the gas in plasma processing region 390 and maintains the desired reactor pressure. Turbomolecular pump 364 is capable of evacuating a system such as TCP™ 9400 typically down to a processing pressure of 0.1–50 milliTorr.

In the present invention, the gas introduced into reaction chamber 350 includes hydrogen and/or deuterium. As a result, the plasma primarily consists of active species such as $H_3^+$, $H_2^+$, $H^+$, and H, and possibly some corresponding deuterium species as well.

A typical process in TCP system 348 begins when substrate 360 is secured by mechanical clamp 392 on chuck 362 inside reaction chamber 350. A source gas is introduced into reaction chamber 350 via gas inlet port 374, which travels through gas ring 370 and is released through openings 380 and 382.

At least RF generator 352 is turned on to energize coil 354 which acts as an electrode. In addition, RF generator 358 may be turned on to energize chuck 362 to act as a second electrode. The RF energy from coil 354 is transmitted through the transparent dielectric window 356 and enters the plasma processing region 390 where it strikes a plasma. If chuck 362 is energized, then the energy from this chuck/electrode imparts additional momentum to charged species in the plasma on their way toward the substrate.

Coil 354 acts as a positively charged electrode and chuck 362 along with substrate 360 acts as a negatively charged electrode. Basically, chuck 362 and substrate 360 together with the plasma act as a type of diode. When chuck 362 is energized by RF generator 358, it rectifies the RF producing a sheath of negatively charged DC voltage at the top of the substrate. The substrate surface is, thus, biased negatively to attract the charged active species toward the substrate surface where they land. Once deposited, the active species migrate through the layered stack as shown in FIG. 3, and reach the poly-Si in source 306A, drain 306B and channel 307.

FIG. 5 is a table that sets forth the approximate preferred values for various parameters employed to conduct the hydrogenation process according to the teachings of the present invention. The parameters of the hydrogenating process as shown in FIG. 4 includes the TCP power, bottom power (i.e., power to the chuck electrode), substrate temperature, hydrogen pressure and processing time.

The TCP power is defined as the power output of the RF generator 352. A higher TCP power tends to generate a higher density of plasma, which depending on other parameters may affect the hydrogenation rate. It generally ranges from about 300 to about 2000 watts, preferably ranges from about 500 to less than about 2000 watts and more preferably is about 1000 watts.

The bottom power is defined as the power output of the RF generator 358. A higher bottom power tends to increase the momentum of the hydrogen ions that impinge upon substrate 360 and facilitates their progress toward the poly- Si structures. It generally ranges from about 0 watts to a value as high as possible without damaging the device in substrate 360, preferably ranges from about 0 to 500 Watts, more preferably from about 50 to 200 watts and most preferably is about 100 watts. The TCP™ 9400 is designed such that the plasma density is controlled by the TCP power and the bias on the substrate is controlled by the bottom power. Because the two power sources affect each other, one may be left constant while the other might be adjusted.

The substrate temperature is approximated from the temperature of chuck 362 which with adequate heat transfer, is roughly the same, or nearly the same as the overlaying substrate. The substrate temperature is preferably high enough to promote the diffusion of the embedded ions through substrate 360, but sufficiently low that hydrogen atoms are not unduly driven from the poly-Si layer. At high substrate temperatures, therefore, a higher rate of diffusion through the substrate is expected. If the electrode temperature is too high, however, the hydrogen ion will be driven out of the poly-Si layer, thereby leaving many silicon atoms with dangling bonds at the grain boundaries. Thus, the electrode temperature must be chosen to balance a good rate of diffusion against stable Si—H bonds at the grain boundaries. Preferably the temperature ranges from about 100° to about 350° C., more preferably ranges from about 250° to about 350° C., and most preferably is about 300° C.

The hydrogen pressure refers to the pressure of hydrogen gas inside chamber 350. If the hydrogen pressure is too low, there might be an inadequate supply of plasma for hydrogenating the substrate. In contrast, if the hydrogen pressure is too high the rate at which the hydrogen ions, $H^+$, $H_2^+$, $H_3^+$ strike the substrate and the diffusion rate of the ions through the substrate are impeded as explained below. Also, the relative abundances of the various active species depends on pressure, with $H_3^+$ dominant at high pressure and $H^+$ dominant at low pressure. Thus, the hydrogen pressure inside chamber 350 must be well balanced to provide an adequate plasma supply and simultaneously promote hydrogenation of substrate 360. It generally ranges from about 0.1 milliTorr to about 50 milliTorr, preferably ranges from about 1 to 30 milliTorr, and more preferably is about 5 milliTorr.

The rate at which the active hydrogen species strike substrate 360 is dictated, at least in part, by the ability of the active species to travel from the top of chamber 350 through plasma processing region 390 without colliding with each other (or electrons) and strike the surface of substrate 360. At high hydrogen pressures, it is believed that due to the smaller mean free path of the hydrogen ions, relatively few ions successfully strike the substrate surface. Thus, the rate at which the active species strike the substrate surface is reduced at high hydrogen pressures. The invention advantageously improves the rate at which active hydrogen species impinge on substrate 360 by employing low hydrogen pressures.

Further, the diffusion rate of the active species is dictated by the ability of the species to diffuse through substrate 360. At higher hydrogen pressures, it is believed that there is a higher density of the $H_3^+$ species (due to additional collisions and combinations of hydrogen ions in the plasma). Because $H_3^+$ is a substantially larger ion than $H^+$ or $H_2^+$, it diffuses relatively slowly. Therefore, a high hydrogen pressure gives rise to a higher percentage of the larger (and slower) hydrogen species, resulting in a slowing of the overall diffusion rate of the active species into substrate 360.

The processing time is defined as the required processing time for a substrate 360 inside reaction chamber 350 to adequately hydrogenate the poly-Si for the particular application. For example, in the present invention, the processing time may be as little as approximately 10 minutes or more per substrate, depending upon the application. In general, longer processing times lead to a greater degree of hydrogenation. However, because longer processing times lead to a reduced throughput, it is desirable to limit the processing time to that necessary for sufficient hydrogenation. For example, the processing time in a preferred embodiment may be approximately 45 minutes to a couple of hours or greater.

In particularly preferred embodiments, various settings for the TCP™ 9400 are set forth. The RF generator 352 energizing coil 354, typically operates at a power of about 1000 watts. The RF generator 358 energizes chuck 362, which typically operates at a temperature of 250° or 200° C. to promote hydrogenation. The flow rate of pure hydrogen gas through the plasma chamber 350 is about 10 sccm. Reaction chamber 350 is thereby pressurized from between about 2 to about 50 milliTorr, where 2, 8, 20 and 50 milliTorr represent typical values for the pressure. The processing time of each substrate ranges from about 10 to 45 minutes.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method of hydrogenating silicon in an electrical device, said method comprising the following steps:

placing a substrate having a silicon component in a radio frequency induced low pressure, inductively coupled plasma reactor;

introducing into said radio frequency induced low pressure, inductively coupled plasma reactor a gas including at least hydrogen or deuterium; and striking a plasma in said radio frequency induced low pressure, inductively coupled plasma reactor under conditions that promote hydrogenation of said silicon component.

2. The method of claim 1, wherein said radio frequency induced low pressure, inductively coupled plasma reactor is a high density plasma reactor.

3. The method of claim 1, wherein said step of striking the plasma is conducted under conditions such that the substrate's temperature is maintained at a temperature to promote hydrogenation.

4. The method of claim 3, further comprising a step of striking the plasma is conducted under conditions such that the substrate's temperature is maintained between about 100° and 350° C.

5. The method of claim 4, wherein the step of striking the plasma is conducted under conditions such that the substrate's temperature is maintained between about 250° and 350° C.

6. The method of claim 5, wherein the step of striking the plasma is conducted under conditions such that the substrate's temperature is maintained at about 300° C.

7. The method of claim 1, wherein the step of introducing a gas into the inductively coupled plasma reactor is accomplished with the assistance of a turbomolecular pump.

8. The method of claim 1 wherein the step of introducing a gas into the inductively coupled plasma reactor provides a gas pressure in the reactor of between about 0.1 and 50 milliTorr.

9. The method of claim 8 wherein the step of introducing a gas into the inductively coupled plasma reactor provides a gas pressure in the reactor of between about 1 and 30 milliTorr.

10. The method of claim 9 wherein the step of introducing a gas into the inductively coupled plasma reactor provides a gas pressure in the reactor of about 5 milliTorr.

11. The method of claim 1, wherein said step of striking a plasma involves supplying radio frequency power to a inductively coupled plasma reactor coil electrode at a power of between about 300 and 2000 Watts.

12. The method of claim 11, wherein said step of striking a plasma involves supplying radio frequency power to the coil electrode at a power of between about 500 and 2000 Watts.

13. The method of claim 12, wherein said step of striking a plasma involves supplying radio frequency power to the coil electrode at a power of about 1000 Watts.

14. The method of claim 1, further comprising a step of applying a bias to an electrode located below said substrate to increase the momentum of charged species striking the substrate.

15. The method of claim 14 wherein said electrode located below said substrate is provided with power at between about 0 and 500 Watts.

16. The method of claim 15 wherein said electrode located below said substrate is provided with power at between about 50 and 200 Watts.

17. The method of claim 16 wherein said electrode located below said substrate is provided with power at about 100 Watts.

18. The method of claim 1, wherein said substrate is exposed to a plasma containing at least energetic hydrogen or deuterium species for a period of time equal to at least about 10 minutes.

19. The method of claim 18, wherein said substrate is exposed to the plasma containing at least energetic hydrogen or deuterium species for a period of time equal to at least about 45 minutes.

20. The method of claim 1, wherein said step of striking a plasma is performed after the electrical device has been completely fabricated except for hydrogenating silicon.

21. A method of hydrogenating silicon in an electrical device, said method comprising the following steps:

placing a substrate having a silicon element in an inductive plasma reactor;

introducing into the inductive plasma reactor a gas including at least hydrogen or deuterium; and striking a plasma in said inductive plasma reactor under conditions that promote hydrogenation of said silicon element, wherein said step of striking the plasma comprises a step of heating the substrate to a temperature of between about 100° and 350° C., said step of introducing a gas into the inductive plasma reactor provides a gas pressure in the reactor of between about 0.1 and 50 milliTorr and said substrate is exposed to the plasma containing at least energetic hydrogen or deuterium species for a period of time equal to at least about 10 minutes.

22. The method of claim 21 wherein said step of striking the plasma comprises a step of heating the substrate to a temperature of between about 250° and 350° C., said step of introducing a gas into the inductive plasma reactor provides a gas pressure in the reactor of between about 1 and 30 milliTorr and said substrate is exposed to the plasma containing at least energetic hydrogen or deuterium species for a period of time equal to at least about 45 minutes.

23. A method of claim 22 wherein said step of striking the plasma comprises a step of heating the substrate to a temperature of between about 100° and 350° C., said step of introducing a gas into the inductive plasma reactor provides a gas pressure in the reactor of between about 1 and 30 milliTorr and said substrate is exposed to the plasma containing at least energetic hydrogen or deuterium species for a period of time equal to at least about 45 minutes.

24. A method of claim 23 wherein said step of striking the plasma comprises a step of heating the substrate to a temperature of between about 250° and 350° C. and supplying radio frequency power to a coil at a power of about 1000 Watts and said substrate is exposed to the plasma containing at least energetic hydrogen or deuterium species for a period of time equal to at least about 45 minutes.

25. A method of preparing an electronic device having multiple thin film transistors, each having a silicon gate electrode, the method comprising the following steps:

forming said multiple transistors on a substrate;

providing said substrate with multiple transistors to a radio frequency induced low pressure, inductively coupled plasma reactor;

introducing into the radio frequency induced low pressure, inductively coupled plasma reactor a gas including at least hydrogen or deuterium;

striking a plasma in said radio frequency induced low pressure, inductively coupled plasma reactor under high density, low pressure conditions that promote hydrogenation of said silicon gate electrodes of the multiple transistors.

26. The method of claim 25, wherein said electronic device is a flat panel display.

27. The method of claim 25, wherein said electronic device is a light valve.

28. The method of claim 25, wherein said substrate includes one or more materials selected from the group consisting of glass, quartz, silicon, gallium arsenide, and polyimide.

29. The method of claim 25, further comprising a step of striking a plasma is conducted under conditions such that the substrate is heated to a temperature of between about 100° and 350° C.

30. The method of claim 25 wherein the step of introducing a gas into the inductively coupled plasma reactor provides a gas pressure in the reactor of between about 0.1 and 50 milliTorr.

31. The method of claim 25, wherein said step of striking a plasma involves supplying radio frequency power to said inductively coupled plasma reactor electrode at a power of between about 300 and 2000 Watts.

32. The method of claim 25, wherein said substrate is exposed to a plasma containing at least energetic hydrogen or deuterium species for a period of time equal to at least about 10 minutes.

33. The method of claim 32, wherein said substrate is exposed to the plasma containing at least energetic hydrogen or deuterium species for a period of time equal to at least about 45 minutes.

34. The method of claim 32, wherein said step of striking a plasma is performed after the electrical device has been completely fabricated except for hydrogenation of the polysilicon.

35. The method of claim 32, wherein said steps of striking a plasma is performed after substantially all other high temperature steps have been performed on said substrate.

36. The method of claim 1, wherein said silicon component includes polysilicon.

37. The method of claim 21, wherein said silicon element includes polysilicon.

38. The method of claim 25, wherein said silicon gate electrode includes polysilicon.

* * * * *